United States Patent
Dong et al.

(10) Patent No.: US 7,820,920 B2
(45) Date of Patent: Oct. 26, 2010

(54) CASING AND MOUNTING DEVICE

(75) Inventors: Yong Dong, Shanghai (CN); Jiebing Pan, Shanghai (CN); Tieming Luo, Shanghai (CN)

(73) Assignee: Raychem Electronics (Shanghai) Ltd., Shanghai (CN)

( * ) Notice: Subject to any disclaimer, the term of this patent is extended or adjusted under 35 U.S.C. 154(b) by 0 days.

(21) Appl. No.: 12/284,036

(22) Filed: Sep. 17, 2008

(65) Prior Publication Data
US 2009/0078460 A1   Mar. 26, 2009

(51) Int. Cl.
*H01L 23/495* (2006.01)

(52) U.S. Cl. .................... 174/536; 174/555

(58) Field of Classification Search ............ 174/520, 174/555, 536; 338/324; 336/90, 92
See application file for complete search history.

(56) References Cited

U.S. PATENT DOCUMENTS

| | | | | |
|---|---|---|---|---|
| 3,838,316 A | * | 9/1974 | Brown et al. | 361/679.01 |
| 3,889,365 A | * | 6/1975 | Brock | 29/856 |
| 5,212,345 A | * | 5/1993 | Gutierrez | 174/556 |
| 5,351,167 A | * | 9/1994 | Wai et al. | 361/760 |
| 5,847,938 A | * | 12/1998 | Gammon | 361/816 |
| 5,963,125 A | * | 10/1999 | Mochida et al. | 338/234 |

* cited by examiner

*Primary Examiner*—Hung V Ngo

(57) ABSTRACT

The present application discloses a casing and a corresponding mounting device, for protecting pins of an element from melting during a process flow in which the element is soldered on a circuit board, while saving an area required for soldering the element on the circuit board. The casing comprises a hollow body provided with at least one opening.

2 Claims, 2 Drawing Sheets ic # CASING AND MOUNTING DEVICE

FIELD OF THE INVENTION

The present invention relates to a casing and a mounting device, more specifically, to a casing provided for assembling an element and a mounting device applied in a soldering process, which contains an element with pins.

BACKGROUND OF THE INVENTION

Generally, an element is soldered on a circuit board in a reflow soldering (surface mount technology (SMT)) manner. As shown in FIG. 1, in the conventional technology, a pin 2 of a positive temperature coefficient of resistance (PTC) thermistor device 1 is soldered on the surface of the PTC device in a tin soldering manner. During the reflow soldering process, the solder joint of the tin soldering may easily melt under high temperature, resulting in the pin's detachment from the surface of the PTC device. Additionally, since pins are relatively fine, a pin 2 on a circuit board 3 may also easily fracture under external force. Moreover, the contacting area between the pin 2 and the circuit board 3 is not large enough to make the center of gravity of the PTC device 1 that is mounted on the circuit board stable.

SUMMARY OF THE INVENTION

The present application provides a casing or housing, the bulk of which is hollow to allow an element to be inserted. Additionally, a base of the casing has a fine groove, which is provided for bending pins of the element as solder joints.

The present application provides a mounting device containing an element with pins. The mounting device protects the solder joints from melting and the pins from fracturing during a process flow, in which the element is welded on circuit boards, while saving an area required for soldering the element on the circuit board.

The present application provides a casing, which comprises a hollow body provided with at least one protruding part on one side where an opening is located.

According to an implementation of the present application, the casing further comprises a guide pole extending from the protruding part.

According to an implementation of the present application, the casing further comprises a base coupled to the hollow body. The case extends in a direction perpendicular to the direction of the opening, and has a fine groove extending to the opening on the bottom surface thereof.

Another aspect of the present application proposes a mounting device having the casing. The mounting device is composed of the casing and an element inside the casing.

The present application further proposes a mounting device having said casing. Pins are bent in the fine groove to form solder joints.

According to an implementation of the present invention, the element includes at least one of a resistor, an inductor, a capacitor, and a transistor.

According to an implementation of the present invention, the element is a thermistor.

In contrast to the prior art, the present invention has the following advantageous effects: the present invention protects the thin soldering joints from melting during the reflow soldering, by setting a casing on the surface of the element and by bending the pins of the element in the fine groove on the base to form solder joints, while protecting the pins from fracturing during the reflow soldering and during the transport.

Additionally, since the hollow body has a protruding part on the side where the opening is located, there is a gap between the hollow body and the circuit board, to allow the reflow soldering.

DETAILED DESCRIPTION OF THE PREFERRED EMBODIMENTS

The present invention will be further described in combination with drawings and embodiments.

Figure 1:
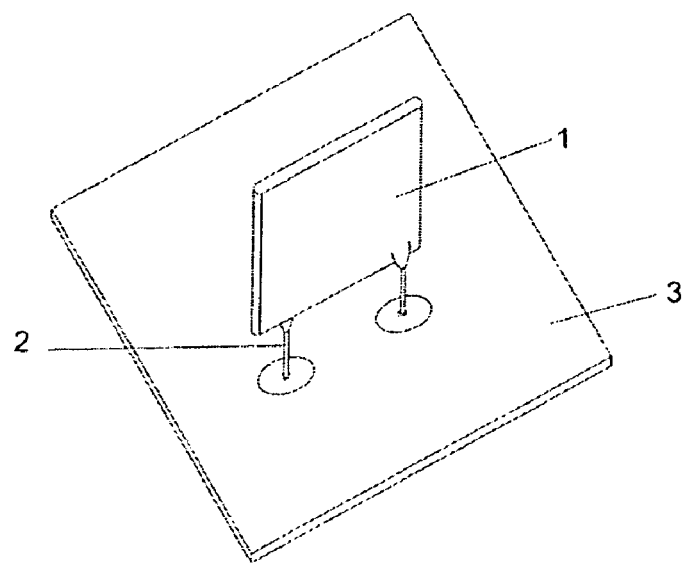
FIG. 1 is a schematic diagram in which a conventional PTC thermistor is soldered on a circuit board.
Figure 2:
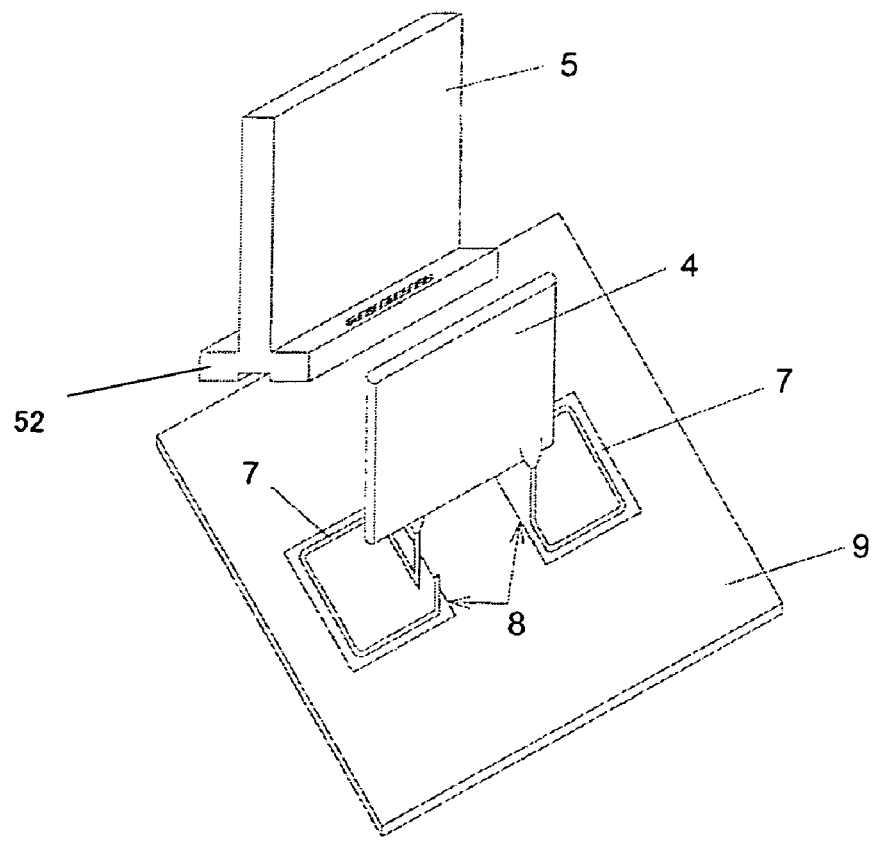
FIG. 2 is a structural schematic diagram in which one embodiment of a thermistor with a casing according to a first implementation of the present application is soldered on a circuit board.
Figure 3:
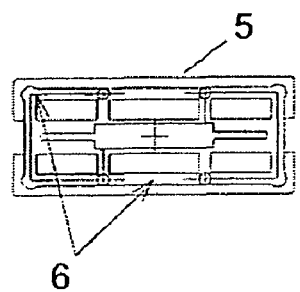
FIG. 3 is a schematic diagram for a base of the casing according to the first implementation of the present application.

Referring to FIGS. 2 and 3, a casing 5 according to the first implementation comprises a hollow body 51, with an opening 50 on one side thereof, and a base 52 extending in a direction perpendicular to the direction of the opening. The body 51 is hollow to allow an element 4 to be inserted. There is a fine groove 6 extending to the opening on a base 52, so as to bend a pin 7 of the element 4 in the fine groove 6 to from a solder joint 8. Preferably, the longer the fine groove 6 is, and the larger the number of the fine groove 6 is, the more solid the soldering on a circuit board 9 will be.

The first implementation of the present invention further presents an element with the above casing, such as a PTC thermistor, and an arrangement of the casing, which is also referred as a mounting device hereinafter. A casing 5 is set on the surface of the PTC thermistor 4, both forming a mounting device together. The base 52 of the casing 5 is shown in FIG. 3. There is a fine groove 6 on the base 52 of the casing 5. The pin 7 is bent in the fine groove 6 to form the solder joint 8. During the reflow soldering, the PTC thermistor is soldered on the circuit board 9 in a soldering manner. Preferably, the longer the fine groove 6 is, and the larger the number of the fine groove 6 is, the more solid that soldering on a circuit board 9 will be. The element may also be a resistor, an inductor, a capacitor, or a transistor, etc.

Figure 4:
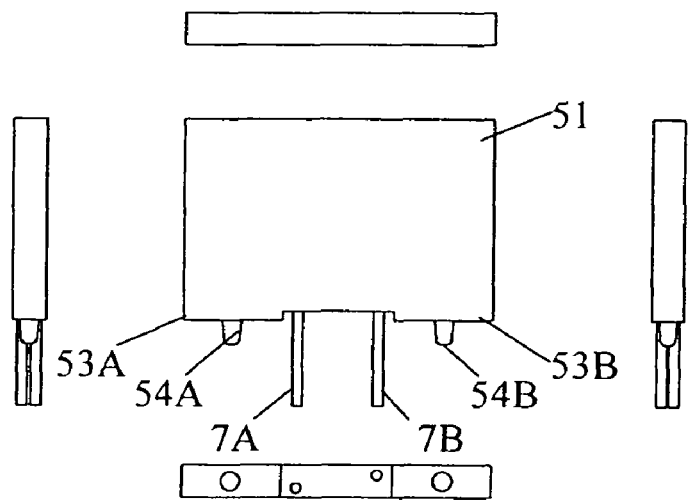
FIG. 4 is a view for a casing according to a second implementation of the application.
Figure 5:
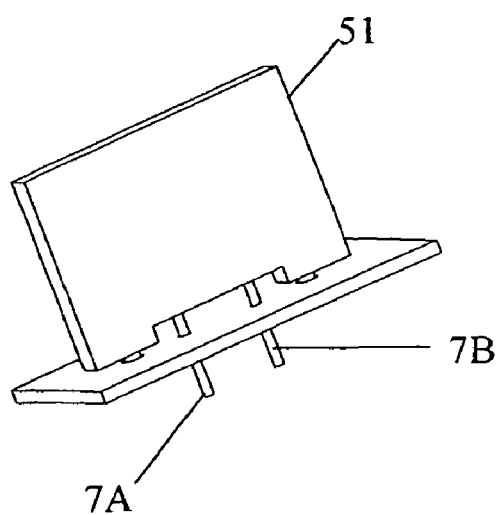
FIG. 5 is a schematic diagram in which the mounting device according to the second implementation of the present application is mounted on a circuit board.

FIG. 4 shows a view for a casing according to a second implementation of the present invention. FIG. 5 shows a schematic diagram in which a mounting device of this implementation is mounted on a circuit board.

As shown in FIGS. 4 and 5, a hollow body 51 has a protruding part 53A and a protruding part 53B, both of which extend from one side where an opening is located. In such a way, when the pins 7A and 7B of the element are inserted into the circuit board to carry out the reflow soldering, there is a gap formed between the hollow body and the circuit board, facilitating the soldering. Additionally, guide poles 54A and 54B are further formed in the protruding directions of the protruding parts on the protruding parts 53A and 53B. The guide poles 54A and 54B are inserted into the guide holes on the circuit board during mounting, to facilitate positioning. The present invention is mainly applied in a process flow in which an element is soldered on the circuit board in the reflow soldering. The present invention has at least one of the following advantages: (1) the casing protects the solder joints of the pins on the surface of the element from melting due to high temperature; (2) the formation of the solder joints improves the soldering fastness of the element on the circuit board; (3) the formation of the solder joints makes the pins soldered on the circuit board not easily fractured; (4) the gap formed between the casing and the circuit board facilitates the reflow soldering; (5) the use of the guide poles facilitates the fast positioning during the element mounting.

The above embodiment is provided for those skilled in the art to implement or use the present invention. Those skilled in the art may make various modifications or changes on the above embodiment, without departing from the inventive idea of the present invention. Therefore, the protection scope of the present application is not intended to be limited by the above embodiment, and shall comply with the maximal range of the innovative features proposed in the claims.

What is claimed is:

1. A mounting device comprising
an element having soldered pins, and
a casing having
   a hollow body for receiving the element and at least one opening to allow the pins to extend from the opening, and
   a base coupled to the hollow body, the base (a) extending in a direction perpendicular to the direction of the opening and (b) having a groove extending to the opening on a bottom surface thereof, at least one pin being bent in the groove to form a solder joint.

2. A mounting device according to claim 1 wherein the element is a thermistor.

* * * * *